United States Patent [19]

Kemmer

[11] Patent Number: 5,424,565
[45] Date of Patent: Jun. 13, 1995

[54] SEMICONDUCTOR DETECTOR

[75] Inventor: Josef Kemmer, Am Isarbach 30, 85764 Oberschleissheim, Germany

[73] Assignee: Josef Kemmer, Oberschleissheim, Germany

[21] Appl. No.: 140,155
[22] PCT Filed: May 7, 1992
[86] PCT No.: PCT/DE92/00358
§ 371 Date: Nov. 4, 1993
§ 102(e) Date: Dec. 30, 1993
[87] PCT Pub. No.: WO92/20105
PCT Pub. Date: Nov. 12, 1992

[30] Foreign Application Priority Data

May 7, 1991 [DE] Germany .................. 41 15 821.5
Jun. 20, 1991 [DE] Germany .................. 41 20 443.3

[51] Int. Cl.⁶ ............................................. H01L 27/14
[52] U.S. Cl. .................................. 257/290; 257/293; 257/458; 257/463; 257/656
[58] Field of Search ............ 257/458, 656, 290, 293, 257/463

[56] References Cited

U.S. PATENT DOCUMENTS 4,837,607  6/1989  Kemmer et al. ............ 257/458

Primary Examiner—Edward Wojciechowicz
Attorney, Agent, or Firm—Antonelli, Terry, Stout & Kraus

[57] ABSTRACT

A position-sensitive semiconductor detector is provided having a completely depleted primary area of a first conductivity and insulation layers on the two main surfaces as well as conductive electrodes on the insulation layers (MIS structure). The invented detector is distinguished by the following features: a) the areas of the first and second conductivity on the two main surfaces required for the depletion of the primary area of the first conductivity are generated by the development of inversion and accumulation zones in the surface area under the MIS contacts from which the influenced signal charge is simultaneously tapped; b) the areas of the first and second conductivity on the two main surfaces required for the depletion of the primary area of the first conductivity are completely enclosed by areas of the opposite conductivity, which are developed by accumulation and inversion of charge carriers and their conductivity is controlled via MIS contacts; and c) an external voltage supply to the areas of the first and second conductivity ensues from the areas of the first and second conductivity, which are both preferably in the area of one of the two main surfaces. Furthermore, the production of the detector structure can be realized in three masking steps.

29 Claims, 6 Drawing Sheets

SEMICONDUCTOR DETECTOR

TECHNICAL FIELD

The present invention relates to a semiconductor detector having a completely or partially depleted primary area.

Semiconductor detectors of this type are utilized to detect ionization radiation and permit readout of both majority as well as minority charge carriers. They are utilized, in particular, in the form of so-called strip detectors for the determination of the position of ionization radiation.

STATE OF THE ART

As is well known, i.a., classical p-i-n-type diodes are used no detect ionization radiation. An essential feature of such p-i-n-type diodes is a high-resistive semiconductor of n-silicon which is provided with a passivating oxide layer. On the front main surface, a window is opened in the passivating layer and a high p-doping is carried out in this area. On the rear main surface also in the surface area is a thin conductive layer of high n-doping. On both areas of high conductivity are metal electrodes. The highly doped p-layer generates an asymmetrical p-n junction, the space charge zone of which extends into the low-doped semiconductor body if the diode is poled in the barrier direction, i.e. if a negative voltage is applied to the p-side. The space charge zone can be utilized to detect electromagnetic and particle radiation. High doping of both contacts is advantageous in order to restrict the diffusion current of the diode.

A semiconductor detector of this type is described in DE-A-37 15 674, corresponding to U.S. Pat. No. 4 896 201. By means of the integration of the readout capacities and the protection resistors, a reduction of the complexity of the external electronic readout is achieved, solely due to which utilization of these detectors in many cases has become possible.

These hitherto known detectors require very complicated engineering in their in fabrication, because several masking steps and implantations have to be conducted on both sides of the semiconductor body. In particular, considering utilization of large quantities of such detectors in fundamental research, manufacturing engineering aspects will play an increasingly important role in the future.

Presentation of the Invention

The object of the present invention is to improve a semiconductor detector in such a manner that simplification of the manufacturing process can be achieved with the same or similar electric properties.

The key element of the present invention consists of not generating the electrodes of high conductivity in both surface areas required for building a space charge zone in a semiconductor body of the first conductivity type by doping, but rather by creating accumulation zones, respectively inversion zones, on both main surfaces. In order to be able to extend the space charge zone in the semiconductor body, conducting connections between the inversion zones, respectively, accumulation zones, and the external voltage sources must be created via suited contacts. The contacts are made highly resistive by an externally controllable resistance layer to the electrodes of the same type of conductivity and are located on one surface of the two main surfaces. These electrodes represent the sole ohmic contact to the outside. The coupling-out of the signal charge occurs capacitatively via the accumulation, respectively the inversion zone, at the outer electrodes.

Furthermore, for decisive savings in the production of the invented, position-sensitive semiconductor detector, the production of the detector structure can be realized in only three masking steps.

Further provisions of the invented solution are to be drawn from the claims.

Especially remarkable in the type of structure and mode of operation of the new semiconductor detector is that no contacts to the semiconductor body itself are required on the rear side of the detector. This side has only an electrode structure on the insulator. In this way, an especially simple manufacturing process for two-faced strip detectors or similar elements has been discovered.

Another feature differenciating the present invention from the state-of-the-art strip detectors is that the conductive areas of the strips are formed by inversion, respectively accumulation, of the charge carriers on both main surfaces and that these strips are completely surrounded by areas of opposite conductivity which are also generated by accumulation, respectively inversion of the charge carriers.

The only technologically doped areas are the source S and the drain D areas of the transistors and a contact area B to the semiconductor body. These dopings can be produced by ion implantation. In an especially simple version, the doping of the contact to the semiconductor can be obviated so that only one doping step (source and drain) is needed.

The invented detector has a whole series of advantages compared to the state-of-the-art detectors of similar design. One of the essential advantages is that the photolithographic steps can be simplified and their number reduced. In the same manner, the number of doping steps can at least be greatly restricted. As doping usually occurs by means of ion implantation and presupposes appropriate masking steps, the new process permits simpler and more cost-favorable manufacturing with high yields. Thus, by way of illustration, a two-faced strip conductor composed of a passivated semiconductor body can be conceived having metal electrodes disposed on the second main surface as the only technological step. The contacting and the voltage supply to the conductive areas occurs from the first main surface.

Another advantage is to be seen in that the outer electrodes do not necessarily need to be disposed on the detector itself, but rather can be located on a separate conductor-strip substrate, e.g. a mylar film, which is only pressed against the insulation layer of the semiconductor body. In such an external conductor-strip substrate, complicated conductor-strips, if need be, in several layers can be realized more easily and more cost-favorably than on the silicon body itself. In this event, the corresponding semiconductor surface does not require structuring at all. Under certain conditions, it is even possible to obviate the insulation layers on the semiconductor body and to integrate them in the external electrode device.

An arrangement of this type is particularly advantageous in semiconductors that can not be passivated or doped at all or only with difficulty.

The electrode arrangement on an external conductor-strip substrate, e.g. a thin film permits producing detectors that require no bonding of any kind on this side. In this way, a hitherto unsolvable problem in the utilization of strip detectors in medical applications requiring a direct contact to the sample is solved in a simple manner.

This arrangement is also advantageous for the productions of so-called pad or pixel detectors in which each pixel, respectively pad, is to be readout separately. When using the invented process with an external conductor-strip substrate, the pad electrodes as well as the respective electronics can be integrated thereon directly. Thus, contacting a large number of pads on the detector is obviated.

Another advantage of the electrode arrangement on an external conductor-strip substrate is that pin holes in the insulation layer of the semiconductor do not necessarily result in short circuits between the metal electrodes and the conductive layer under the oxide. In state-of-the-art manufactured detectors, such short circuits lead to malfunction of the capacitative coupling and thus to failure.

An additional use of the external electrode arrangement is also to be seen in that with a suited readout of the conductor-strip substrate material, the latter can serve as an absorber for a specific wavelength, respectively an energy range, of the incident radiation (absorber, filter).

BRIEF DESCRIPTION OF THE INVENTION

The manner of functioning of the invented detector is made more apparent using preferred embodiments, wherein.

DESCRIPTION OF THE PREFERRED EMBODIMENTS

Figure 1A:
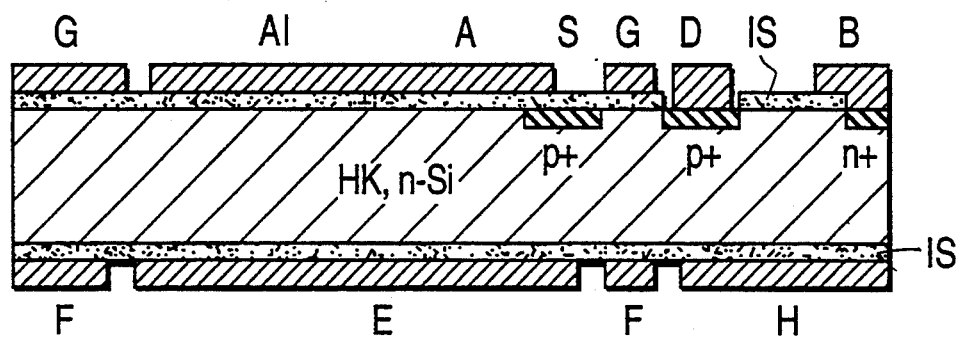
FIG. 1(A to C) shows cross-section having a first preferred embodiment of a hole-inversion zone and capacitative readout of the minority carriers (holes) and also having an electron-accumulation zone and capacitative readout of the majority carriers (electrons).
Figure 1B:
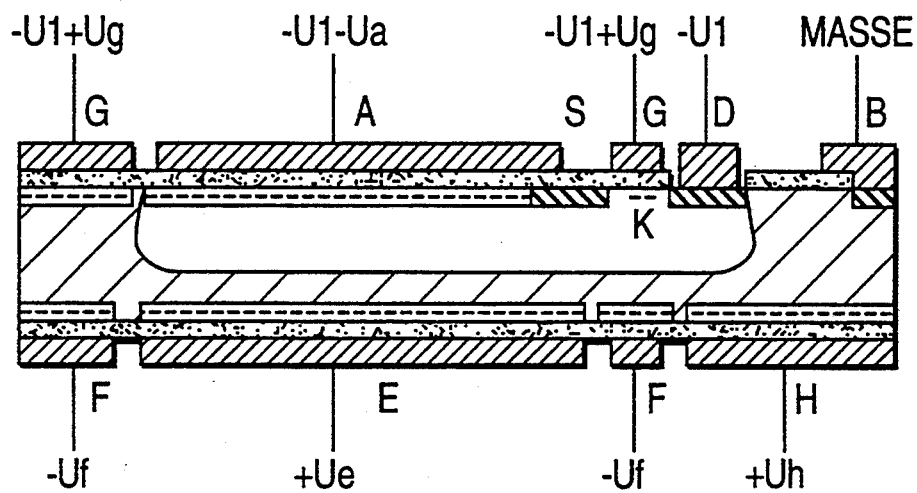
Figure 1C:
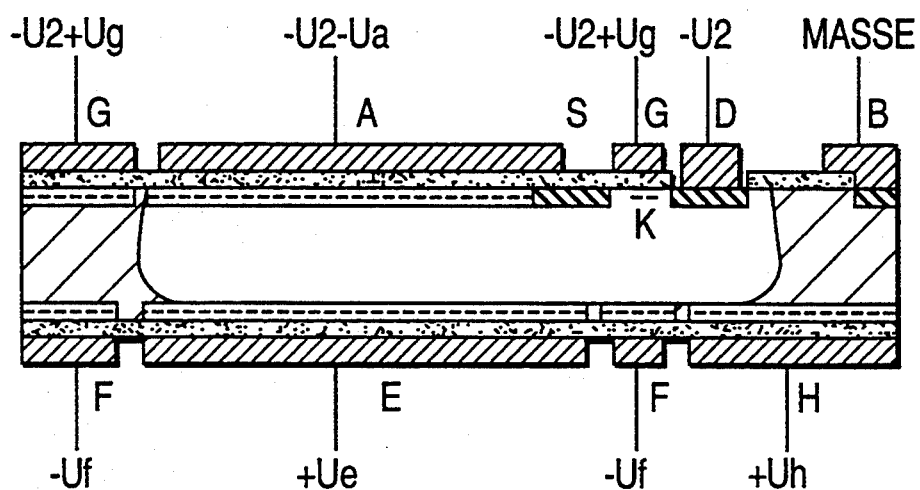
Figure 2A:
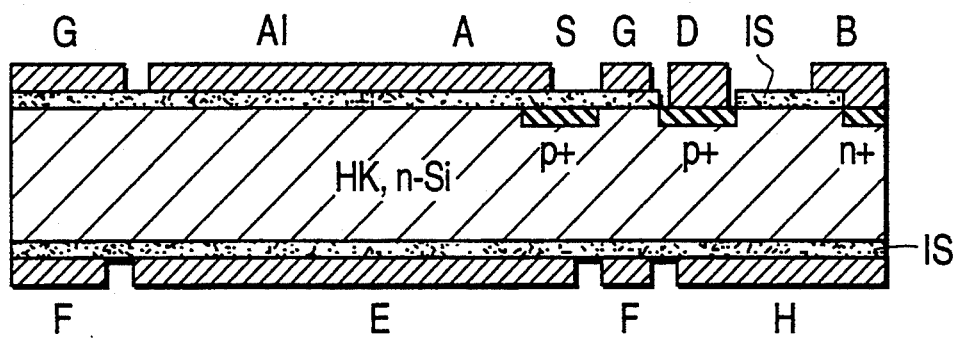
FIG. 2(A and B) shows a cross-section of a first preferred embodiment according to FIG. 1 and a schematic representation of the electrode arrangement on the top main surface.
Figure 2B:
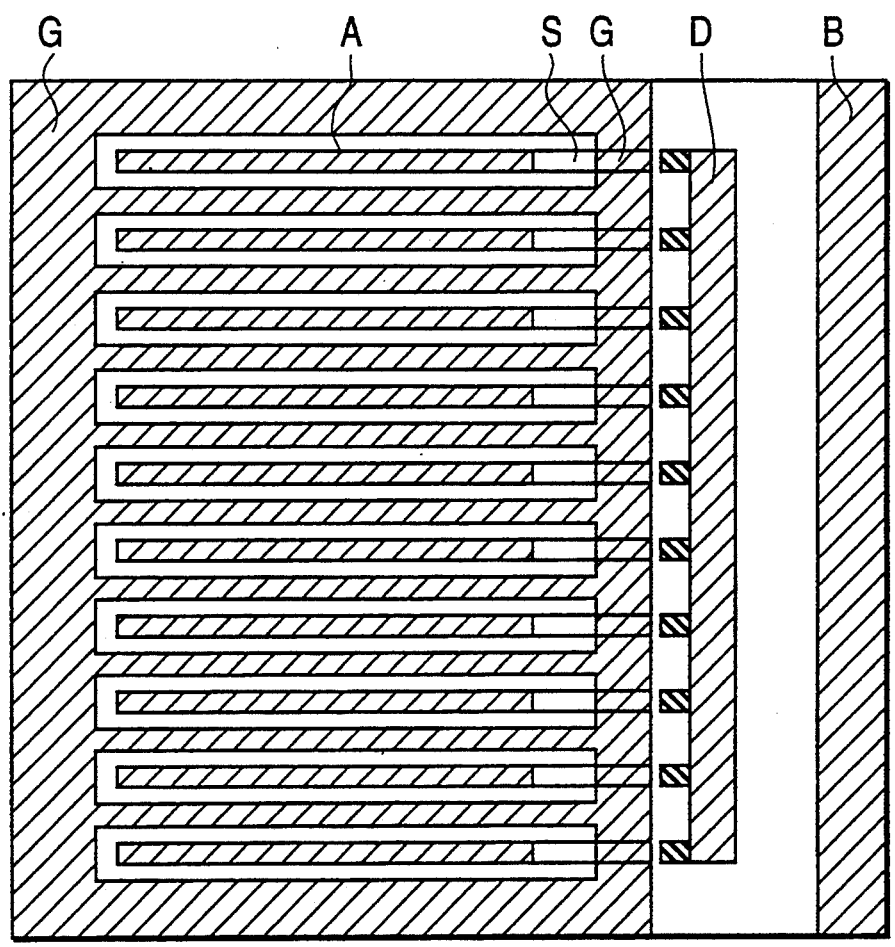
Figure 3A:
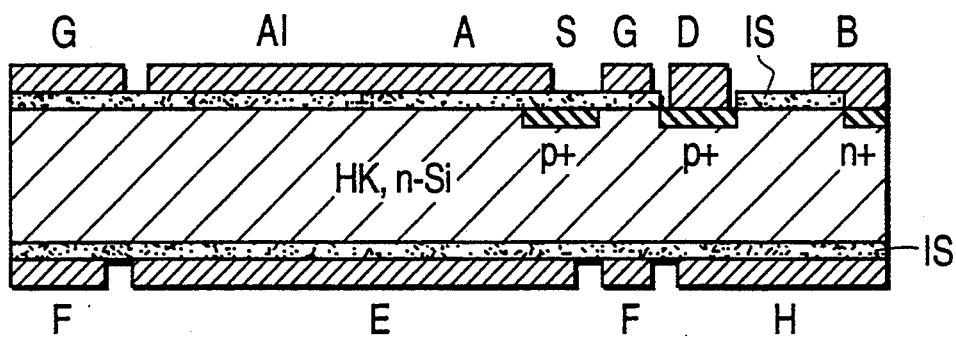
FIG. 3(A and B) shows a cross-section of a first preferred embodiment according to FIG. 1 and a schematic representation of the electrode arrangement on the bottom main surface.
Figure 3B:
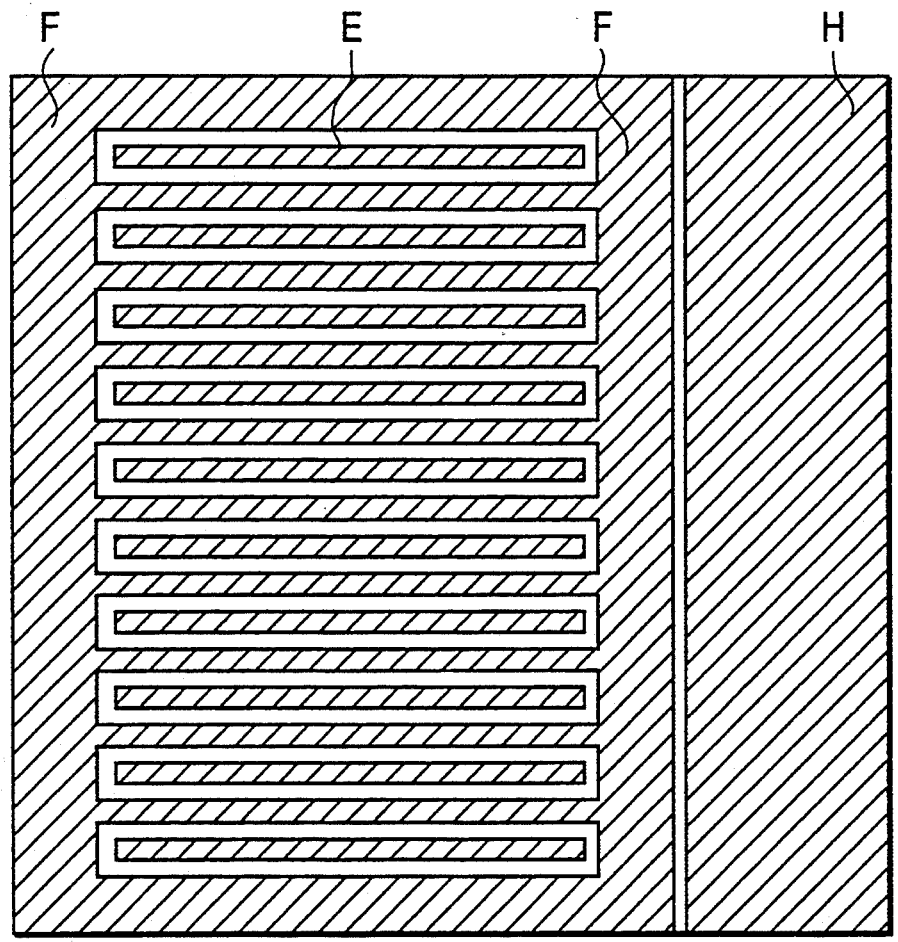

FIG. 1 to FIG. 3 show a first preferred embodiment of an invented position-sensitive strip detector. It consists of an array of strip-shaped metal electrodes on both main surfaces which are electrically insulated from one another and electrode arrangements for the voltage supply. The same is true of FIGS. 4 to 6 although they show different contact possibilities on the main surfaces.

Due to technical drawing reasons, the strip systems on both main surfaces are arranged parallel to each other. In practice, however, they are arranged opposite each other at a certain angle, preferably at 90°, in order to permit determining the position in both coordinate directions.

The cross-section representation in FIG. 1 A shows a section of both strip systems in a longitudinal direction. Depicted is a semiconductor body HK made of n-silicon on both main surfaces of which is an approximatley 2000 A thick insulation zone IS made of silicon oxide. Disposed thereon are metal electrodes made of aluminum AL. On the top main surface are the strip electrode A and on its front face a transistor with the areas S (source), G (gate) and D (drain) serving to supply voltage to the inversion zone under the electrode A. The strips A are surrounded on all four sides by the gate electrode G (see FIG. 2 B). Next to it, a contact B is also provided which serves to contact the semiconductor body. Disposed on the insulation zone of the bottom main surface is a metal contact E and the electrode system F enclosing it as well as an auxiliary electrode H.

In order to operate the detector (FIG. 1B), a small negative voltage $-Ua$ is applied to the strip electrodes A resulting in a positive inverson zone under the insulator at the semiconductor surface. This inversion zone is contacted by the source area S of the adjacent transistor. A minimal positive voltage $+Ug$ at the electrode system G (transistor gate) insulates the individual strips with high-resistively from one another and simultaneously produces the contact to a external voltage source $-U1$ via the transistor channel K and the drain area D.

The contact B ensures electric connection to the semiconductor body, respectively to the rear-side main surface, and is connected to ground in the preferred embodiment.

If an additional negative voltage $-U1$ (see FIG. 1B) is applied to the drain area D of the transistor, to the gate area G ($-U1+Ug$) and to the strip electrode A ($-U1-Ua$), a space charge zone develops under the inversion zone of the front main surface, which expands in the semiconductor body with increasing voltage. The detector thus behaves exactly like a p-i-n-type diode whose space charge zone does not yet reach the rear contact. Charge carriers formed by the ionization radiation in the volume of the space charge zone are separated by the electric field. The holes running on the front side can be readout capcatively via the metal electrode A and flow via the transistor to the voltage source $-U1$. The electrons travel through the semiconductor body to the ground contact B.

If the blocking voltage continues to be raised to $-U2$ (see FIG. 1C), the detector can be completely depleted, which also permits capacitative coupling out of the electron signal. For this purpose, a conductive accumulation zone of electrons on the bottom main surface is generated by a small positive voltage $+Ue$ on the rear-side electrode. The electrode E is completely enclosed by a protection electrode F which is weakly negatively poled ($-Uf$) and represents a high-resistive connection to another external accumulation zone under the positively poled auxiliary electrode H ($+Uh$). The width of the auxiliary electrode H is measured in such a manner that the accumulation zone lying thereunder expands to the area of the semiconductor body that is not depleted. Thus, a conductive connection between this zone and the ground electrode B is ensured throughout the semiconductor body.

A signal charge of electrons traveling under the described operation conditions to the accumulation zone under the electrode E can be readout capacitatively. The electric circuit of the electrons is shut off from the accumulation zone under E via the highly-resistive inversion zone of the electrode F to the accumulation zone under H and furthermore via the semiconductor body HK to the ground contact B.

FIGS. 2 and 3 show the same preferred embodiment having a schematic representation of a strip configuration on the two main-surfaces. For better understanding, the source, gate and drain areas of the transistors are depicted enlarged. In practice, contrary to the drawing, a small contact to the implanted drain area suffices.

The metal electrodes disposed on the insulation layers of the semiconductor body may be completely or partially replaced by a suitably metallized contact substrate. The bottom main surface of the semiconductor, particularly according to FIGS. 1 to 3, is suited for this preferred embodiment. The contact substrate is pressed against the surface of the semiconductor; the pressing pressure by the electrostatic forces upon application of the potentials to the electrodes can already be high enough to produce an intimate contact to the insulation surface. Components of the readout electronics can be integrated on this substrate and can simultaneously serve as protection against contamination and light scatter.

Arrays or sandwich arrangements of several detectors can easily be conceived with the aid of one or several contact substrates.

The invented detector arrangement utilizing a separate contact substrate represents a simplification, because the electronics in conjunction with the conductor strips can be accommodated on the contact substrate. If the semiconductor detector is destroyed by radiation damage, the contact substrate with the integrated electronics can be reused.

With thermal oxidation of the silicon, a positive oxide charge always develops when n-type silicon is used which results in an electron accumulation zone under the oxide. This effect can be utilized in the preferred embodiment according to FIG. 1 to 3 to obviate the external voltages ($+Ue$ and $+Uh$) at the electrode areas E and H of the bottom main surface. Thus, only the control voltage $-Uf$ for adjusting the series resistor between both accumulation zones under E and H is required for the bottom main surface.

Positive charges can; e.g., also be formed by treating the oxide layers in a gas plasma or with UV light, respectively ionization radiation.

Figure 4A:
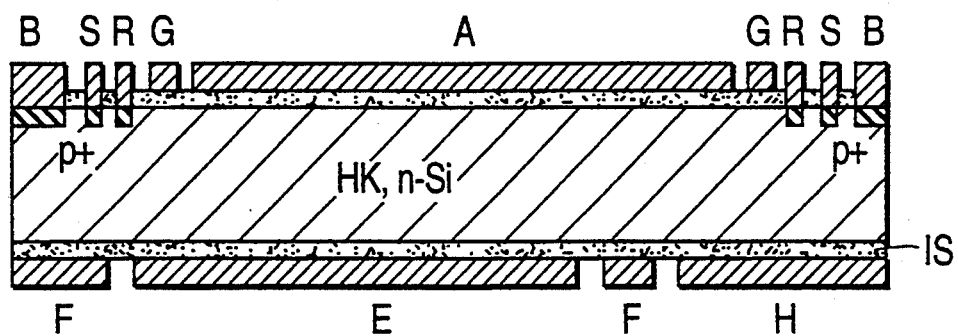
FIG. 4(A and B) shows a cross-section and a top view of another preferred embodiment.
Figure 4B:
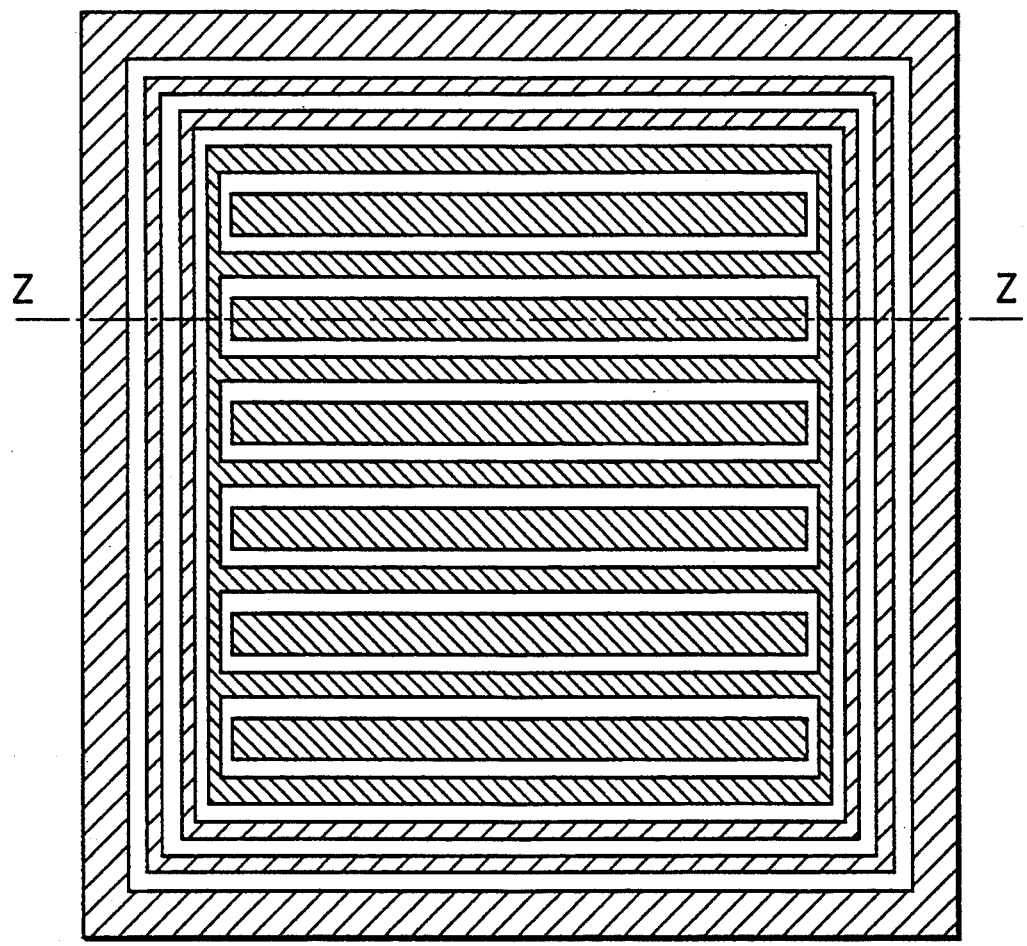

The cross-section representation in FIG. 4A shows a section of the two strip systems in longitudinal direction. Depicted is a semiconductor HK made of n-silicon on whose two main surfaces is an approximately 2000 Å thick insulation layer IS made of silicon oxide. The metal electrodes made of aluminum AL are disposed thereupon.

The subject-matter here is a symmetrical buildup in which the front side of the semiconductor body is provided locally with p+ implantation.

On the top main surface is a strip electrode A and at the front face thereof is a transistor-like arrangement of electrodes having the areas G (gate), R and S as well as electrode B. In this case, the internal electrode ring R is provided for voltage supply of the inversion zone. Electrode ring S connected thereto, it may also be several rings, serves as a guard ring for reducing the voltage. The external ring B represents the ground contact.

The distance between the front face of the strip electrodes A and the gate amounts in this case to between 3 and 10 $\mu$m. On the other hand, the distances at the longitudinal sides amount to between 20 and 200 $\mu$m.

A high-resistive connection is provided between the inversion zone under the strips and under the implanted ring R developing when a negative voltage is applied to the strip electrode.

The metal electrodes act, in this case, in a self-adjusting manner, because they can be produced in one masking step.

Figure 5A:
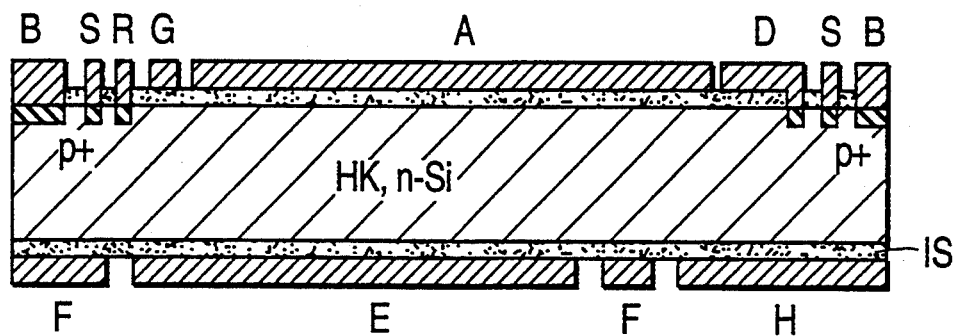
FIG. 5(A and B) shows a cross-section and a top view of another preferred embodiment.
Figure 5B:
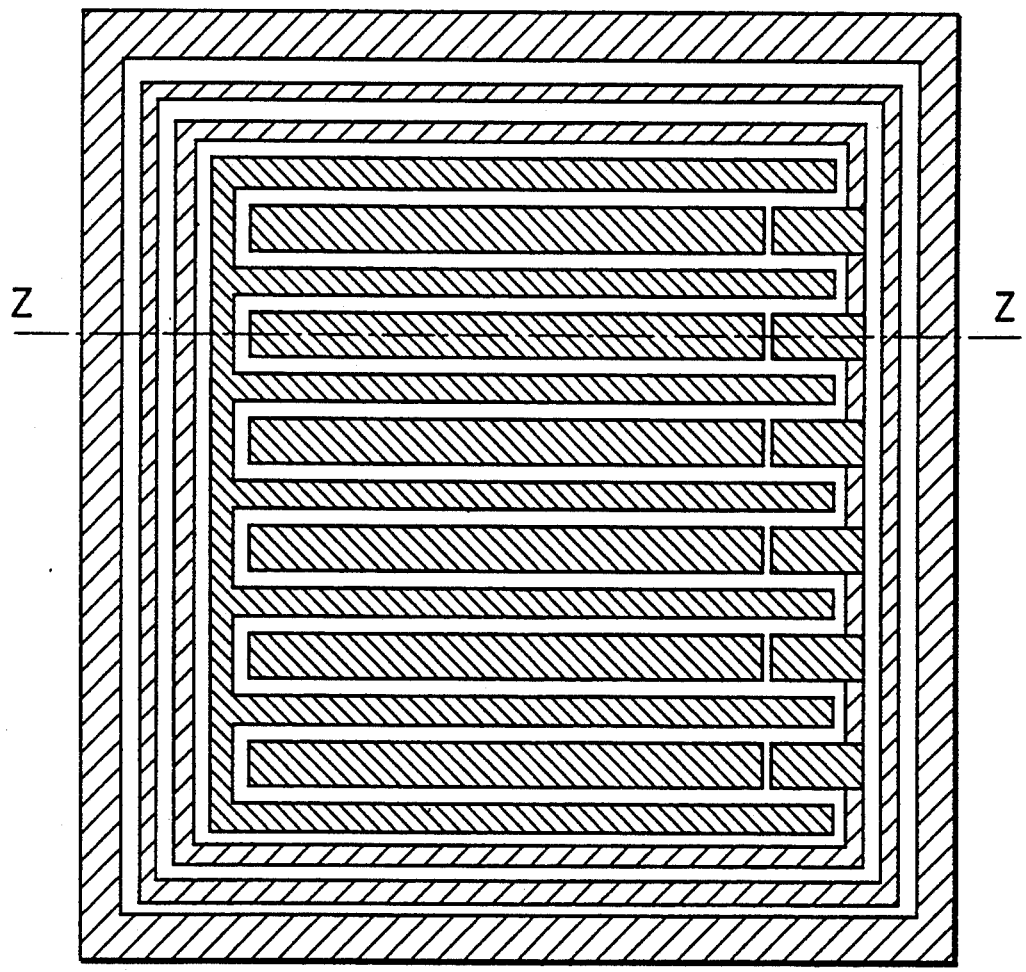

FIG. 5 shows an asymmetrical design of a semiconductor detector in which the gate electrode G does not enclose the strips completely.

The outer areas of the sensor structure are identical to the aforementioned preferred embodiment. However, in this case, the tongue-shaped field plates are connected to the implanted ring S. Under normal operation voltage, an inversion zone which produces the high-resistive contact to the inversion zone of the strips develops under the tongues D.

Here too the metal electrodes act in a self-adjusting manner, because they can be produced in a single masking step.

Figure 6A:
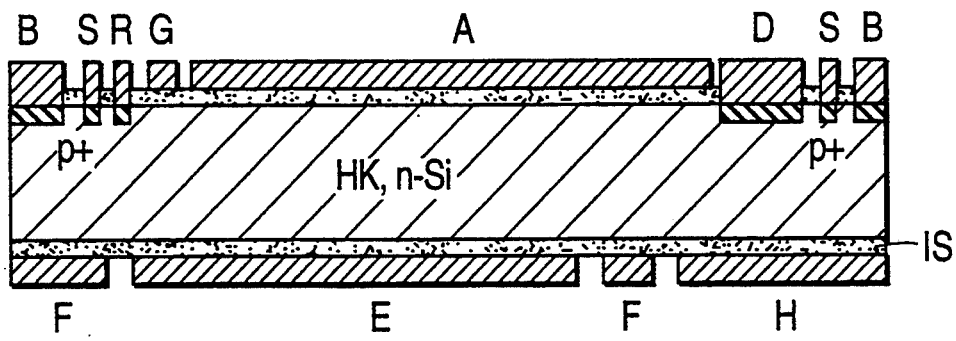
FIG. 6(A and B) shows a cross-section and a top view of another preferred embodiment.
Figure 6B:
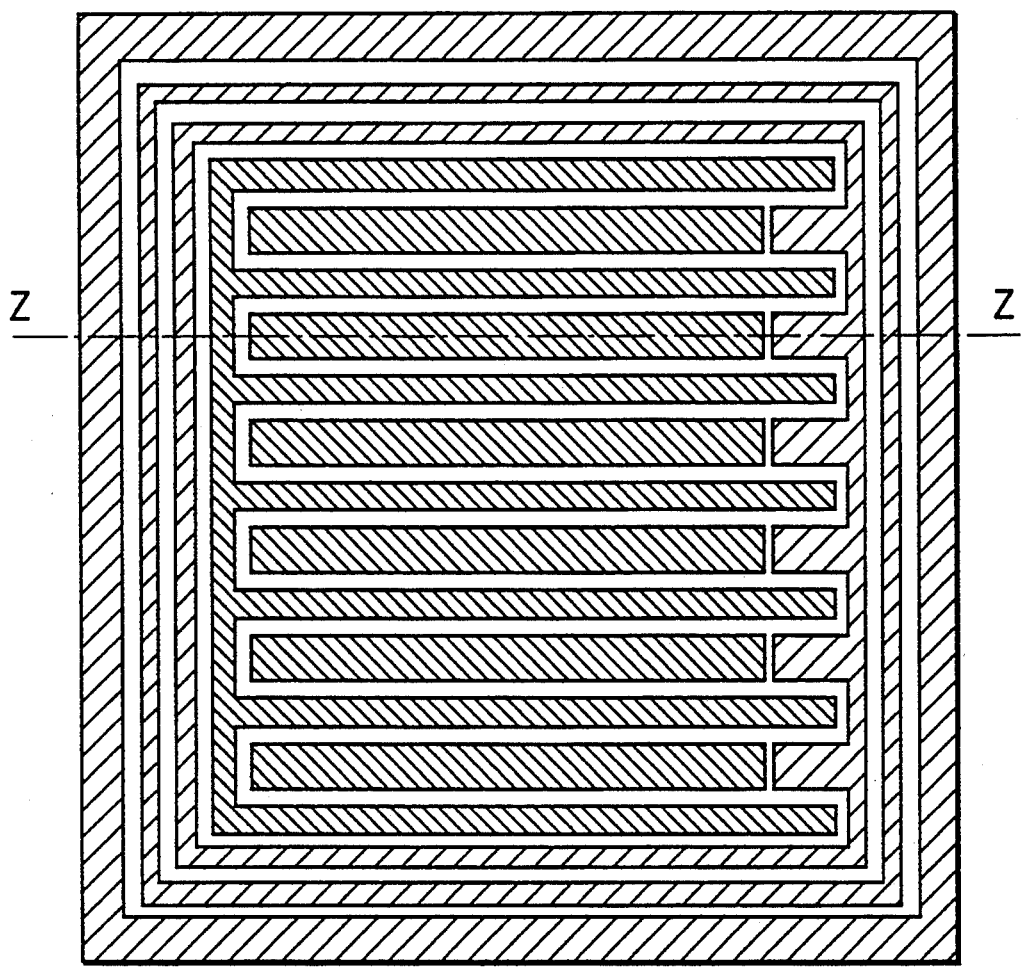

In the preferred embodiment of FIG. 6, another asymmetrical design of an invented semiconductor detector is described, whose internal ring R is provided with tongues on one side. The contact between the inversion zone developing under the strip and the tongues is in this case brought about by an oxide gap of approximately 3 $\mu$m.

In the preceding section, preferred embodiments are described without the intention of limiting the general scope and spirit. Naturally, various modifications are possible within the framework of the overall inventive idea, e.g. the utilization of other semiconductor materials, insulators and conductors. In particular, instead of an n-type semiconductor, a p-type semiconductor can also be usefully employed. Furthermore, detectors can be conceived in which MIS structures and technologically doped areas of both conductivities can be utilized side by side.

What is claimed is:

1. A position-sensitive semiconductor detector having a completely depleted primary area of a first conductivity type and areas of a second conductivity type on at least one of the two main surfaces, wherein insulation layers are formed on the two main surfaces and conductive electrodes are formed on said insulation layers to provide MIS contacts, characterized by the following features: a) the areas of the first and second conductivity type on the two main surfaces required for the depletion of said primary area of said first conductivity type are generated by the development of inversion and accumulation zones in surface areas under the MIS contacts from which an influenced signal charge is simultaneously tapped; b) the areas of the first and second conductivity type on said two main surfaces required for the depletion of said primary area of said first conductivity type are respectively completely enclosed by areas of opposite conductivity type, which are developed by accumulation and inversion of charge carriers and their conductivity is controlled via MIS-contacts; and c) an external voltage supply to said areas of said first (accumulation layer) and Second (inversion layer) conductivity type is provided from areas of said first and second conductivity type which are produced by doping.

2. A detector according to claim 1, characterized in that only one electrode is provided for the voltage supply to said areas of said first conductivity type.

3. A detector according to claim 1 or 2, characterized in that only one electrode is provided for the voltage supply to said areas of said second conductivity.

4. A detector according to one of the claims 1 or 3, characterized in that said insulation layer and the conductive contacts form a unit with said semiconductor body (MIS structure).

5. A detector according to one of the claims 1 or 2, characterized in that the external conductive contacts are disposed on a separate conductor-strip substrate and the latter is connected to said semiconductor body.

6. A detector according to one of the claims 1 or 2, characterized in that both said insulation layer and said external conductive contacts of said MIS structure are disposed on a separate conductor-strip substrate, which is connected to said semiconductor body.

7. A detector according to one of the claims 1 or 2, characterized in that said insulation layer is composed of several layers.

8. A detector according to the claims 1 or 2, characterized in that inversion and accumulation zones are generated by charges in or on said insulation layer.

9. A detector according to one of the claims 1 or 2, characterized in that the charges in said insulation layer are generated by electromagnetic or particle radiation.

10. A detector according to one of the claims 1 or 2, characterized in that charges in said insulation layer are generated during the manufacturing process of said layer.

11. A detector according to one of the claims 1 or 2, characterized in that said external conductor-strip substrate also contains components of the electronics.

12. A detector according to one of the claims 1 or 2, characterized in that it is designed as a detector arrangement in which several individual detectors are disposed together on an external conductor-strip substrate.

13. A detector according to one of the claims 4, characterized in that said external conductor-strip substrate simultaneously serves as protection against contamination for said semiconductor.

14. A detector according to one of the claims 1 or 2, characterized in that said external conductor-strip substrate is simultaneously to be utilized as an absorber for radiation of defined wavelength, respectively energy.

15. A detector according to one of the claims 1 or 2, characterized in that it is designed as a sandwich arrangement in such a manner that a mutual external conductor-strip substrate is located between two layers of semiconductors.

16. A detector according to one of the claims 1 or 2, characterized in that a second semiconductor of the same or a different type is used as said external conductor-strip substrate.

17. A detector according to one of the claims 1 or 2, characterized in that it is designed as a two-faced strip detector, with the voltage supply to the strips of the first conductivity occurs high-resistively via a MOS structure and an adjacent area of the first conductivity.

18. A detector according to claim 17, characterized in that the voltage supply to the strips of the second conductivity occurs high-resistively via a transistor structure, with the areas of said strips containing the source area of the transistors.

19. A detector according to claim 17, characterized in that with the strip-shaped arrangement of the metal electrodes, respectively, the conductive contacts on both main surfaces of said detector, said electrodes or contacts are arranged at a specific angle, 90° to each other.

20. A position-sensitive semiconductor detector according to claim 1, wherein said areas of first and second conductivity type which are produced by doping are formed in one of said two main surfaces.

21. A position-sensitive semiconductor detector according to claim 19, wherein said specified angle is 90°.

22. A position-sensitive semiconductor detector having a completely depleted primary area formed by areas of first and second conductivity type on two main surfaces of a semiconductor body, wherein insulation layers are formed on the two main surfaces and conductive electrodes are formed on said insulation layers to provide MIS contacts, characterized by the following features:

a) the areas of the first and second conductivity type on the two main surfaces required for the depletion of said primary area are generated by the development of inversion and accumulation zones in surface areas under the MIS contacts from which an influenced signal Charge is simultaneously tapped;

b) the areas of the first and second conductivity type on said two main surfaces required for the depletion of said primary area are respectively completely enclosed by areas of opposite conductivity type, which are developed by accumulation and inversion of charge carriers and their conductivity is controlled via MIS-contacts; and c) an external voltage supply to said areas of said first and second conductivity type is provided from other areas of said first and second conductivity type which are produced by doping.

23. A position-sensitive semiconductor detector according to claim 22, wherein said other areas of first and second conductivity type which are produced by doping are formed in one of said two main surfaces.

24. A position-sensitive semiconductor detector comprising:

a semiconductor body having upper and lower main surfaces;

a first insulating layer formed on said upper main surface;

a second insulating layer formed on said lower main surface;

a first electrode formed on said first insulating layer;

a second electrode formed on said second insulating layer; and means for applying a negative voltage to said first electrode to form an inversion layer in said upper main surface of said semiconductor body under said first electrode, and means for applying a positive voltage to said second electrode to form an accumulation layer in said lower main surface of said semiconductor body, under said second electrode, wherein said inversion layer and said accumulation layer operate in conjunction with one another to form a depleted primary area for detection of ionization radiation.

25. A position-sensitive semiconductor detector according to claim 24, wherein said detector further comprises:

a third electrode formed on said first insulating layer, said third electrode being arranged to surround said first electrode;

a fourth electrode formed on said second insulating layer, said fourth electrode being arranged to surround said second electrode;

means for applying a positive voltage to said third electrode to form an accumulation layer in said upper main surface of said semiconductor body surrounding said inversion layer formed under said first electrode; and means for applying a negative voltage to said fourth electrode to form an inversion layer in said lower main surface of said semiconductor body surrounding said accumulation layer formed under said second electrode.

26. A position-sensitive semiconductor detector according to claim 24 or 25, wherein said negative voltage applied to said first electrode has a greater magnitude than said positive voltage applied to said second electrode.

27. A position-sensitive semiconductor detector according to claim 24 or 25, wherein the magnitude of the negative voltage applied to said first electrode and the positive voltage applied to said second electrode is sufficient to completely deplete a primary area between said upper and lower main surfaces of said semiconductor body.

28. A position-sensitive semiconductor detector according to claim 24 or 25, wherein said detector further comprises power supply means for supplying power to said inversion layer formed under said first electrode, said power supply means including a MISFET formed by doped source and drain regions formed in said Upper main surface of said semiconductor body, adjacent to said first electrode, and a gate electrode formed on an insulating layer over said upper main surface of said semiconductor body in a location between said doped source and drain regions.

29. A position-sensitive semiconductor detector according to claim 27, wherein said detector further comprises power supply means for supplying power to said inversion layer formed under said first electrode, said power supply means including a MISFET formed by doped source and drain regions formed in said upper main surface of said semiconductor body, adjacent to said first electrode, and a gate electrode formed on an insulating layer over said upper main surface of said semiconductor body in a location between said doped source and drain regions.

* * * * *